United States Patent
Noui-Mehidi

(10) Patent No.: US 9,741,916 B2
(45) Date of Patent: Aug. 22, 2017

(54) SYSTEM AND METHOD FOR HARVESTING ENERGY DOWN-HOLE FROM AN ISOTHERMAL SEGMENT OF A WELLBORE

(71) Applicant: Saudi Arabian Oil Company, Dhahran (SA)

(72) Inventor: Mohamed Nabil Noui-Mehidi, Dhahran (SA)

(73) Assignee: SAUDI ARABIAN OIL COMPANY (SA)

( * ) Notice: Subject to any disclaimer, the term of this patent is extended or adjusted under 35 U.S.C. 154(b) by 483 days.

(21) Appl. No.: 13/949,385

(22) Filed: Jul. 24, 2013

(65) Prior Publication Data

US 2015/0027507 A1    Jan. 29, 2015

(51) Int. Cl.
H01L 35/30 (2006.01)
E21B 34/06 (2006.01)
E21B 41/00 (2006.01)
F25B 9/04 (2006.01)

(52) U.S. Cl.
CPC .......... *H01L 35/30* (2013.01); *E21B 41/0085* (2013.01); *F25B 9/04* (2013.01)

(58) Field of Classification Search
CPC ....... E21B 41/0085; E21B 34/06; H01L 35/30
USPC ................. 136/201, 205; 166/381
See application file for complete search history.

(56) References Cited

U.S. PATENT DOCUMENTS

| 3,118,286 A | 1/1964 | Schroeder |
| 5,701,751 A | 12/1997 | Flores |
| 5,827,357 A | 10/1998 | Farion |
| 6,769,487 B2 | 8/2004 | Hache |
| 6,978,828 B1 | 12/2005 | Gunawardana |
| 7,258,169 B2 | 8/2007 | Fripp et al. |
| 7,263,836 B2 | 9/2007 | Gunawardana et al. |
| 7,571,770 B2 | 8/2009 | DiFoggio et al. |
| 7,647,979 B2 | 1/2010 | Shipley et al. |
| 2004/0168716 A1 * | 9/2004 | Gritskevich ......... H02K 44/085 136/205 |
| 2005/0211436 A1 | 9/2005 | Fripp et al. |

(Continued)

FOREIGN PATENT DOCUMENTS

| DE | 1345137 A1 * | 6/1995 | ............... F25B 9/04 |
| GB | 2433753 A | 7/2007 | |

(Continued)

OTHER PUBLICATIONS

Keller, DE1345137A1, English Machine Translation, pp. 1-9.*

(Continued)

*Primary Examiner* — Jeffrey T Barton
*Assistant Examiner* — Tae-Sik Kang
(74) *Attorney, Agent, or Firm* — Bracewell LLP; Constance Gall Rhebergen

(57) ABSTRACT

Systems and methods of generating power in a wellbore extending through a subterranean formation are described. A swirling flow of pressurized fluid is passed through a vortex tube to generate a temperature differential between first and second outlets of the vortex tube. The temperature differential is applied to a thermoelectric generator configured to convert the temperature differential into a voltage. The thermoelectric generator produces electrical power that is transmittable to down-hole tools within the wellbore such as an inflow control valve.

13 Claims, 3 Drawing Sheets

(56) References Cited

U.S. PATENT DOCUMENTS

| | | | |
|---|---|---|---|
| 2008/0029624 A1* | 2/2008 | Shkolnikov | H01L 35/30 |
| | | | 239/690 |
| 2008/0223579 A1 | 9/2008 | Goodwin | |
| 2009/0188721 A1* | 7/2009 | Smith | E21B 21/14 |
| | | | 175/66 |
| 2011/0146967 A1 | 6/2011 | Winslow | |
| 2011/0162736 A1 | 7/2011 | Kaul et al. | |
| 2012/0067594 A1* | 3/2012 | Noske | E21B 34/08 |
| | | | 166/373 |
| 2012/0125614 A1 | 5/2012 | Verma et al. | |
| 2013/0005372 A1 | 1/2013 | Strei et al. | |

FOREIGN PATENT DOCUMENTS

| | | |
|---|---|---|
| JP | S59216480 A | 12/1984 |
| RU | 2233352 C1 | 7/2004 |
| RU | 2234161 C1 | 8/2004 |
| RU | 2534397 C2 | 11/2014 |
| WO | 0040835 A1 | 7/2000 |
| WO | 0140621 A1 | 6/2001 |
| WO | 03046333 A2 | 6/2003 |
| WO | WO 2005113741 A1 * 12/2005 | ............... B01L 7/52 |
| WO | 2009123466 A1 | 10/2009 |

OTHER PUBLICATIONS

PCT International Search Report and The Written Opinion of the International Searching Authority dated Jul. 31, 2015; International Application No. PCT/US2014/046957; International Filing Date: Jul. 17, 2014.

Ahmad, T. J., et al.; Energy Harvesting Powered Wireless Monitoring and Control in Oil and Gas; SPE Middle East Intelligent Energy Conference and Exhibition held in Dubai, UAE; Oct. 26-30, 2013; SPE 167486; Society of Petroleum Engineers, 2013.

Balmer, R.T., "Pressure-Driven Ranque-Hilsch Temperature Separation in Liquids", Journal of Fluids Engineering, Jun. 1998, vol. 110(2), pp. 161-164.

De Vera, G. "The Ranque-Hilsch Vortex Tube", May 10, 2010, pp. 1-10.

Williams, D.T., "Ranque-Hilsch Vortex Tube for Refrigeration in Developing Communities", dissigno, San Francisco, CA, 2005, pp. 1-5.

* cited by examiner

SYSTEM AND METHOD FOR HARVESTING ENERGY DOWN-HOLE FROM AN ISOTHERMAL SEGMENT OF A WELLBORE

BACKGROUND OF THE INVENTION

1. Field of the Invention

The present invention relates to operations in a wellbore associated with the production of hydrocarbons. More specifically, the invention relates to a system and method of generating electrical power in the wellbore by controlling fluid flow within the wellbore, such as the inflow of a production fluid into the wellbore.

2. Description of the Related Art

Often instruments and tools that require electrical power are positioned at down-hole locations within hydrocarbon producing wells. For example, electrically powered sensors are employed to monitor temperature, pressure, flow rates and other down-hole conditions. Other electrically powered tools deployed to down-hole locations are actively controlled to achieve various objectives. For instance, down-hole valves are often opened and closed for the long term management of reservoir performance over a lifetime of the reservoir, which is often 20 years or more. Electrically conductive cables have been deployed to connect these down-hole tools to a power source disposed at a surface location. These cables are expensive and prone to failure in the harsh environment of a wellbore.

There is a need in the industry for systems that can be installed at down-hole locations within a wellbore to provide electrical power to sensors, valves or other wellbore instruments over time. Additionally, there is a need for systems that can manage the production of fluids from wellbores which often extend through separate production zones having distinct characteristics such as pressure, porosity and water content. If not properly managed, the variation in these characteristics can contribute to undesirable production patterns.

SUMMARY OF THE INVENTION

Described herein are systems and methods for providing electrical power in a down-hole environment. The systems and methods employ a vortex tube, which is operable to generate a temperature differential in response to fluid flow therethrough. The vortex tube includes a first relatively warm outlet and a second relatively cool outlet, which are operatively coupled to a thermoelectric generator. The vortex tube is operable to generate the temperature differential in otherwise generally isothermal segments of a wellbore.

According to one aspect of the invention, a power generation system for generating electric power in a wellbore formed in a subterranean formation includes a source of pressurized fluid, a thermoelectric generator operable to generate a voltage in response to an applied temperature differential, and a vortex tube operatively coupled to the thermoelectric generator to apply the temperature differential thereto. The vortex tube includes an elongate hollow body, an inlet in fluid communication with the source of pressurized fluid, a first outlet in thermal communication with a radially outer region of the elongate hollow body, and a second outlet in thermal communication with a radially inner region of the elongate hollow body. The first outlet is operatively associated with a high temperature input to the thermoelectric generator, and the second outlet is operatively associated with a low temperature input to the thermoelectric generator.

In some embodiments, the inlet of the vortex tube is operable to be in fluid communication with the subterranean formation, and the source of pressurized fluid is a production fluid within a production zone of the subterranean formation. In some embodiments, the first and second outlets of the vortex tube are operable to be in fluid communication with a production tubing such that a flow path defined between the subterranean formation and the production tubing extends through the vortex tube.

In some embodiments, the power generation system further includes an electrically powered down-hole tool in electrical communication with the thermoelectric generator, wherein the electrically powered down-hole tool is operable to selectively receive power generated by the thermoelectric generator. In some embodiments, the electrically powered down-hole tool is an inflow control valve configured for regulating a flow of fluids between an interior and an exterior of a production tubing extending through the subterranean formation. In some embodiments, the power generation system further includes a power storage device electrically coupled between the thermoelectric generator and the electrically powered down-hole tool.

In some embodiments, the vortex tube is configured as a counter-flow vortex tube with the first and second outlets disposed on longitudinally opposite sides of the elongate hollow body.

According to another aspect of the invention, a power generation system for harvesting energy in a wellbore extending through a subterranean formation includes a thermoelectric generator operable to generate a voltage in response to an applied temperature differential and a vortex tube operatively coupled to the thermoelectric generator to apply the temperature differential thereto. The vortex tube includes an elongate hollow body, an inlet operable to be in fluid communication with the subterranean formation and operable to generate a swirling flow of a production fluid along a radially outer region of the elongate hollow body, a first outlet disposed in the radially outer region of the elongate hollow body and operable to discharge a first portion of the swirling flow of production fluid, a restrictor operable to redirect a second portion of the flow of production fluid from the radially outer region of the elongate hollow body to a radially inner region of the elongate hollow body, and a second outlet disposed in the radially inner region of the elongate hollow body and operable to discharge a second portion of the swirling flow of production fluid. The first outlet is operatively coupled to a high temperature input to the thermoelectric generator, and the second outlet is operatively coupled to a low temperature input of the thermoelectric generator.

In some embodiments, the vortex tube is disposed in an annular region defined between the subterranean formation and a production tubing extending through the subterranean formation. In some embodiments, the annular region is defined between two longitudinally spaced isolation members extending around the production tubing and engaging an annular wall of subterranean formation. In some embodiments, a pressure differential of about 300 psi is defined between an inlet to the vortex tube and an aperture defined in the production tubing, wherein the aperture is in fluid communication with the first and second outlets of the vortex tube. In some embodiments, an inflow control valve is disposed at an aperture defined in the production tubing, wherein the aperture is in fluid communication with the first and second outlets of the vortex tube, and wherein the inflow control valve is electrically coupled to the thermoelectric generator to receive power therefrom.

In some embodiments, the power generation system further includes first and second thermocouples respectively in thermal communication with the first and second outlets of the vortex tube, wherein the first and second outlets of the vortex tube are respectively operably coupled to the high and low temperature inputs of the thermoelectric generator through the first and second thermocouples. In some embodiments, the restrictor is movable with respect to elongate hollow body such that an annular orifice defining the first outlet of the vortex tube is adjustable in size. In some embodiments, the inlet of the vortex tube is in fluid communication with a perforation defined through a casing disposed around the production tubing.

According to another aspect of the invention, a method of generating power in a wellbore extending through a subterranean formation includes (i) producing a production fluid from the subterranean formation into the wellbore, (ii) passing the production fluid through a vortex tube to generate a temperature differential between first and second outlets of the vortex tube, and (iii) converting the temperature differential into a voltage.

In some embodiments, the method further includes transmitting electrical power to a down-hole tool from a thermoelectric generator operatively coupled to the vortex tube to convert the temperature differential into the voltage. In some embodiments, the method further includes operating the down-hole tool to selectively pass the production fluid through an aperture defined in a production tubing extending through the subterranean formation.

BRIEF DESCRIPTION OF THE DRAWINGS

So that the manner in which the above-recited features, aspects and advantages of the invention, as well as others that will become apparent, are attained and can be understood in detail, a more particular description of the invention briefly summarized above may be had by reference, to the embodiments thereof that are illustrated in the drawings that form a part of this specification. It is to be noted, however, that the appended drawings illustrate only preferred embodiments of the invention and are, therefore, not to be considered limiting of the invention's scope, for the invention may admit to other equally effective embodiments.

DETAILED DESCRIPTION OF THE EXEMPLARY EMBODIMENTS

Figure 1:
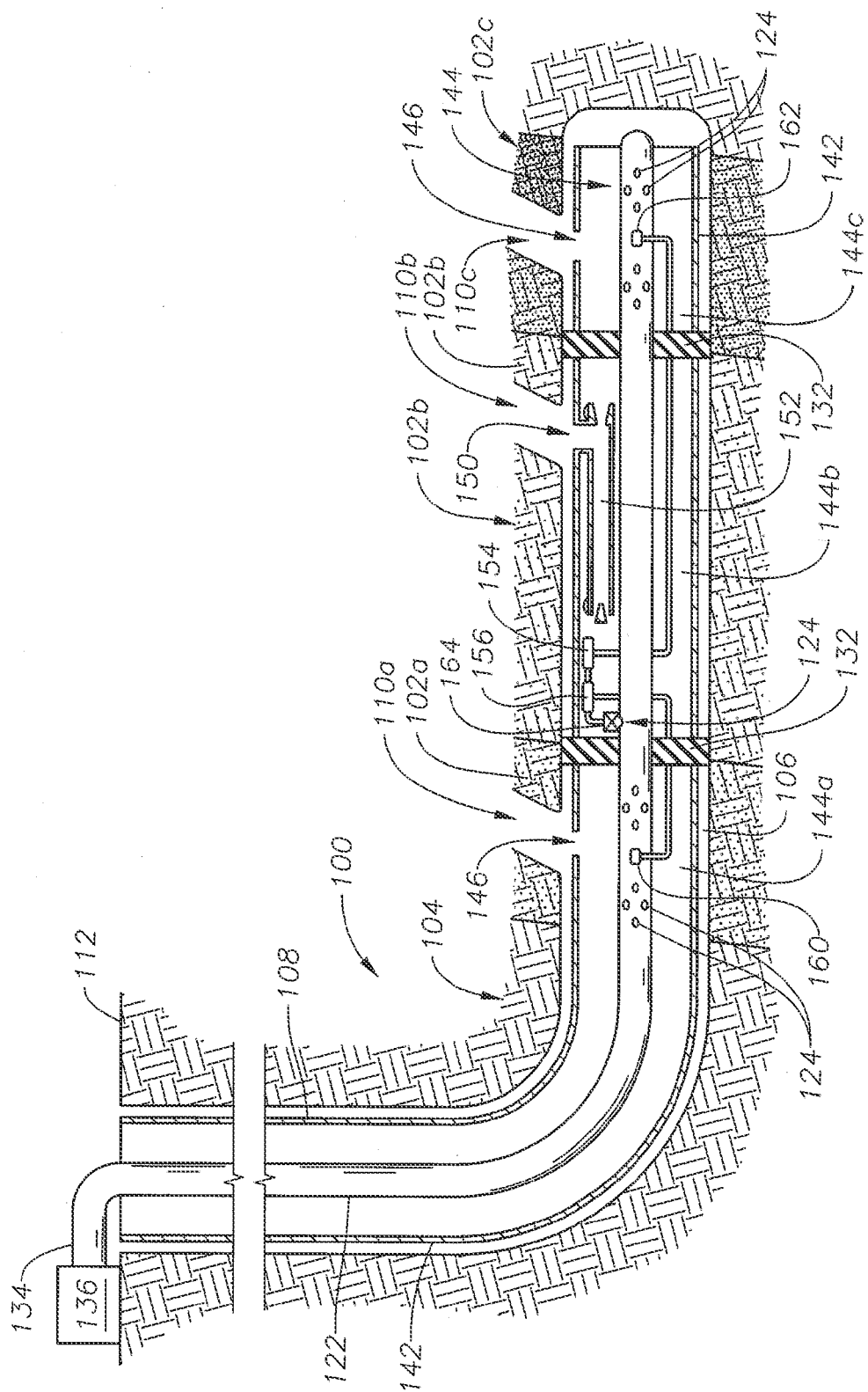
FIG. 1 is a schematic cross-sectional view of a wellbore extending through a plurality of production zones and having an electrical power generation system therein in accordance with an embodiment of the present invention.

Shown in side sectional view in FIG. 1 is one example embodiment of a wellbore 100 extending through three production zones 102a, 102b and 102c defined in a subterranean formation 104. The production zones 102a, 102b and 102c include oil or some other hydrocarbon containing fluid that is produced through wellbore 100. As will be appreciated by one skilled in the art, although wellbore 100 is described herein as being employed for the extraction of fluids from subterranean formation 104, in other embodiments (not shown), wellbore 100 is equipped to permit the injection of fluids into subterranean formation 104, e.g., in a fracturing operation carried out in preparation for hydrocarbon extraction.

Wellbore 100 includes a substantially horizontal portion 106 that intersects production zones 102a, 102b and 102c, and a substantially vertical portion 108. In other embodiments (not shown), an orientation of wellbore 100 is entirely substantially vertical, or deviated to less than horizontal. In the example embodiment depicted in FIG. 1, lateral branches 110a, 110b, and 110c extend from substantially horizontal portion 106 into respective production zones 102a, 102b, 102c, and facilitate the recovery of hydrocarbon containing fluids therefrom. In other embodiments (not shown) no lateral branches are provided. Substantially vertical portion 108 extends to a surface location 112 that is accessible by operators for monitoring and controlling equipment installed within wellbore 100. As depicted in FIG. 1, the surface location 112 is a terrestrial location, and in other alternative embodiments (not shown), the surface location 112 is a subsea location Production tubing 122 extends from surface location 112 through substantially horizontal portion 106 of wellbore 100. Production tubing 122 includes apertures 124 defined therein, which permit the passage of fluids between an interior and an exterior of the production tubing 122. Fluids entering through apertures 124 are transmitted through production tubing 122 to surface location 112, where surface flow line 134 couples production tubing 122 to a reservoir 136 for collecting fluids recovered from the subterranean formation 104. A casing 142 is provided around production tubing 122, defining annular regions 144a, 144b and 144c therebetween. Perforations 146 or other openings are provided in casing 142 to permit fluid flow into annular regions 144a, 144b and 144c from respective production zones 102a, 102b, 102c.

In this example embodiment, isolation members 132 are provided, which are operable to fluidly isolate annular regions 144a, 144b and 144c from one another. Isolation members 132 are constructed as swellable packers extending around the exterior of the production tubing 122 and engaging an annular wall of subterranean formation 104. The isolation members 132 serve to isolate the production zones 102a, 102b and 102c from one another within wellbore 100 such that fluids originating from one of the production zones 102a, 102b and 102c flow into respective corresponding annular regions 144a, 144b, 144e.

Power generation system 150 is provided in wellbore 100 for generating electricity while controlling the inflow of production fluids into production tubing 122 from annular region 144a, 144b, 144c. Power generation system 150 generally includes vortex tube 152, thermoelectric generator 154, power storage device 156, and electrically powered down-hole tools including flow sensors 160, 162, and inflow control valve 164 configured for regulating the flow of fluids between production tubing 122 and annular region 144b. As described in greater detail below, flow of production fluids through vortex tube 152 is associated with a temperature differential established within vortex tube 152. This temperature differential is employed to drive thermoelectric generator 156, which in turn generates an electric current. The electric current is delivered either directly to an electrically powered down-hole tool such as flow sensor 162, or through power storage device 156, which supplies electrical power to electrically powered down-hole tools such as flow sensor 160 and inflow control valve 164. Inflow control valve 164 is configured as any type of valve with a gate, ball or other electrically powered closure member operable to selectively and adjustably permit or restrict fluid flow through aperture 124 defined in production tubing 122. As one skilled in the art will recognize, power generation system 150 is also operable to provide electrical power to other electrically powered down-hole tools (not shown), such as motors, solenoids, pumps, etc. and/or to surface equipment (not shown).

Vortex tube 152 also increases resistance in the flow of production fluids from annular region 144b into production tubing 122 with respect to the flow of production fluids from annular regions 144a, 144c into production tubing 122. In some embodiments, this increase in the resistance to flow is employed to equalize or otherwise control the relative inflow of fluids from production zones 102a, 102b and 102c.

Figure 2:
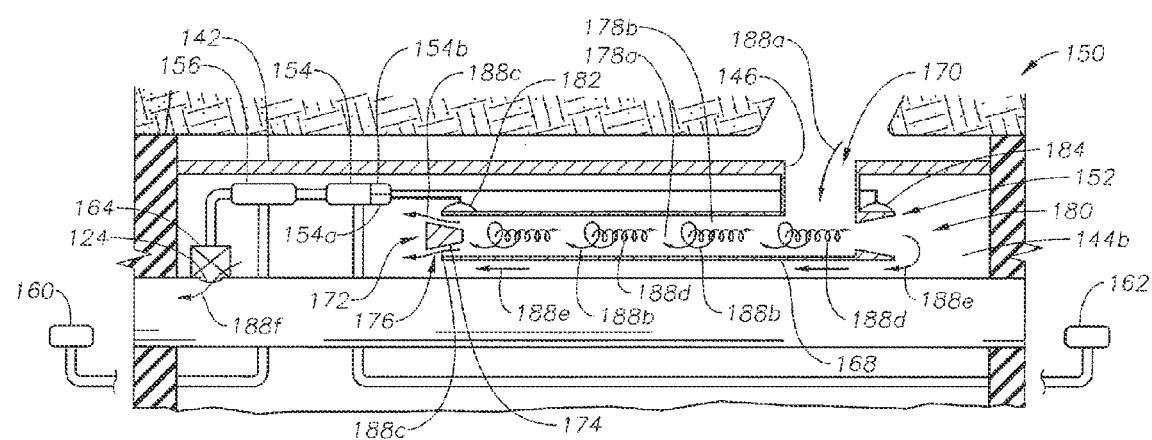
FIG. 2 is an enlarged schematic cross-sectional view of the power generation, system of FIG. 1 illustrating a fluid flow path extending through a vortex tube installed on the exterior of a production tubing.

Referring now to FIG. 2, power generation system 150 is described in greater detail Vortex tube 152 includes an elongate hollow body 168 with an inlet 170 in fluid communication with perforation 146 in casing 142. Inlet 170 is arranged to generate a swirling flow of fluid entering vortex tube 152 therethrough. Curved walls, helical protrusions or other features are contemplated for generating the swirling flow as known in the art. A first outlet 172 is defined at a longitudinal end of elongate hollow body 168 opposite inlet 170, and a restrictor 174 is disposed within first outlet 172. In the embodiment depicted in FIG. 2, restrictor 174 is in the form of a cone valve movable longitudinally with respect to elongate hollow body 168 such that an annular orifice 176 disposed at a radially outer region 178a of elongate hollow body 168 is variable or adjustable in size. In other embodiments (not shown) restrictor 174 is stationary with respect to elongate hollow body 168 such that annular orifice 176 is fixed. A second outlet 180 is defined at a longitudinal end of elongate hollow body 168 adjacent inlet 170. Second outlet 180 is disposed at a radially inner region 178b of elongate hollow body 168. Vortex tube 152 is configured as a "counter-flow" vortex tube with first and second outlets 172, 180 disposed on longitudinally opposite sides of elongate hollow body 168. Other configurations are contemplated such as a "uni-flow" vortex tube (see FIG. 3) wherein first and second outlets are disposed on a common longitudinal side of an elongate hollow body.

A first thermocouple is 182 is coupled to elongate hollow body 168 adjacent first outlet 172 and a second thermocouple 184 is coupled to elongate hollow body 168 adjacent second outlet 180. Thermocouples 182, 184 are operably coupled to thermoelectric generator 154 such that thermoelectric generator 154 converts a temperature differential defined between the thermocouples 182, 184 to a voltage. First thermocouple 182 is operatively associated with high temperature input 154a of thermoelectric generator 154 and second thermocouple 154b is operatively associated with low temperature input 154b of thermoelectric generator 154. Thermoelectric generator 154 is electrically coupled to power storage device 156, which in exemplary embodiments is a rechargeable battery. Power storage device 156 is operable to maintain the voltage generated by thermoelectric generator 154 and selectively distribute power to inflow control valve 164 and flow sensor 160. In some embodiments (not shown) flow sensor 162 is also coupled to power storage device 156 rather than being directly coupled to thermoelectric generator 154.

Referring still to FIG. 2, a flow path is defined between production zone 102b in subterranean formation 104 and production tubing 122 that extends through vortex tube 152. A production fluid produced under pressure from production zone 102b enters inlet 170 of vortex tube 152 through perforation 146 in casing 142 as indicated by arrow 188a. The inlet 170 is configured to generate a swirling flow of the production fluid along radially outer region 178a of elongate hollow body 168 as indicated by arrows 188b. A first portion of the production fluid is discharged through first outlet 172 as indicated by arrow 188c. Restrictor 174 redirects a second portion of the production fluid from radially outer region 178a to radially inner region 178b of elongate hollow body 168. A swirling flow of the second portion of the production fluid traverses radially inner region 178b and is discharged through second outlet 180 as indicated by arrows 188d. A radial temperature separation in the production fluid is observable with this type of swirling, motion inside vortex tube 152. The production fluid exiting through first outlet 172 exhibits a higher temperature than the production fluid exiting through second outlet 180.

Once the production fluid has been discharged from vortex tube 152, the production fluid flows through annular region 144b to inflow control valve 164 as indicated by arrows 188e. The flow of production fluid through annular region 144b is depicted as a generally uncontained flow. In other embodiments (not shown), pipes or passageways are provided to guide the flow of production fluid through annular region 144b.

The production fluid is selectively permitted to enter production tubing 122 through inflow control valve 164 as indicated by arrows 188f. In some embodiments, a pressure differential of about 300 psi is defined between inlet 170 to vortex tube 152 and aperture 124 defined in production tubing 122. This pressure differential is at least in part due to frictional forces imparted to the production fluid by vortex tube 152. The friction al forces are partially dependent on a length and diameter of vortex tube as well as a size and configuration of inlet 170 and first and second outlets 172, 180. In some embodiments this pressure differential facilitates equalization or regulation of the flow of production fluid into production tubing 122 from annular region 144b with respect to the flows of production from annular regions 144a and 144c. In this manner, vortex tube 152 serves as a passive inflow control device.

Figure 3:
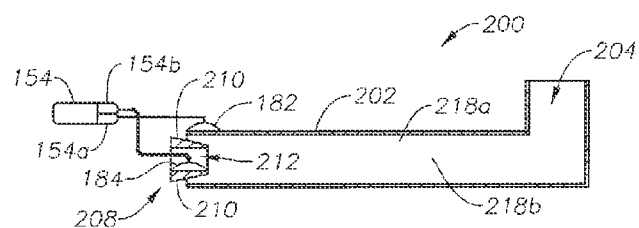
FIG. 3 is a schematic cross-sectional view of a vortex tube for use in an alternate embodiment of the present invention.

Referring now to FIG. 3, vortex tube 200 is depicted in accordance with an alternate embodiment of the present invention. Vortex tube 200 includes elongate hollow body 202 with an inlet 204 arranged to generate a swirling flow of fluid entering vortex tube 200 therethrough. A first outlet 208 is defined at a longitudinal end of elongate hollow body 202 opposite inlet 204. Restrictor 210 is disposed within first outlet 208, and a second outlet 212 is defined through restrictor 210. First outlet 208 is disposed at a radially outer region 218a of elongate hollow body 202 and second outlet 212 is disposed at a radially inner region 218b of elongate hollow body 202. Radial temperature separation in fluid flowing through vortex tube 200 causes first outlet 208 to exhibit a higher temperature than second outlet 212. Thus, first and second thermocouples 182, 184 are operable to be coupled to first and second outlets 208, 212, and to high and low temperature inputs 154a, 154b of thermoelectric generator 154 to apply a temperature differential to thermoelectric generator 154.

The configuration of vortex tube 200 is described as a "uni-flow" vortex tube with first and second outlets 208, 212 disposed on a common longitudinal side of elongate hollow body 202. The temperature separation observed in a uni-flow vortex tube is generally less prominent than the temperature separation observed in a counter-flow vortex tube. A uni-flow vortex tube such as vortex tube 200 presents certain advantages when placed in an annular space surrounding production tubing 122 (FIG. 2) where space is limited. For example, in some embodiments, first and second outlets 208, 212 disposed on a common longitudinal side of elongate hollow body 202 permit a larger diameter elongate hollow body 202 to be employed since there is no need for fluid to flow along an outside of vortex tube 200 in the manner described above with reference to arrows 188e (FIG. 2).

Figure 4:
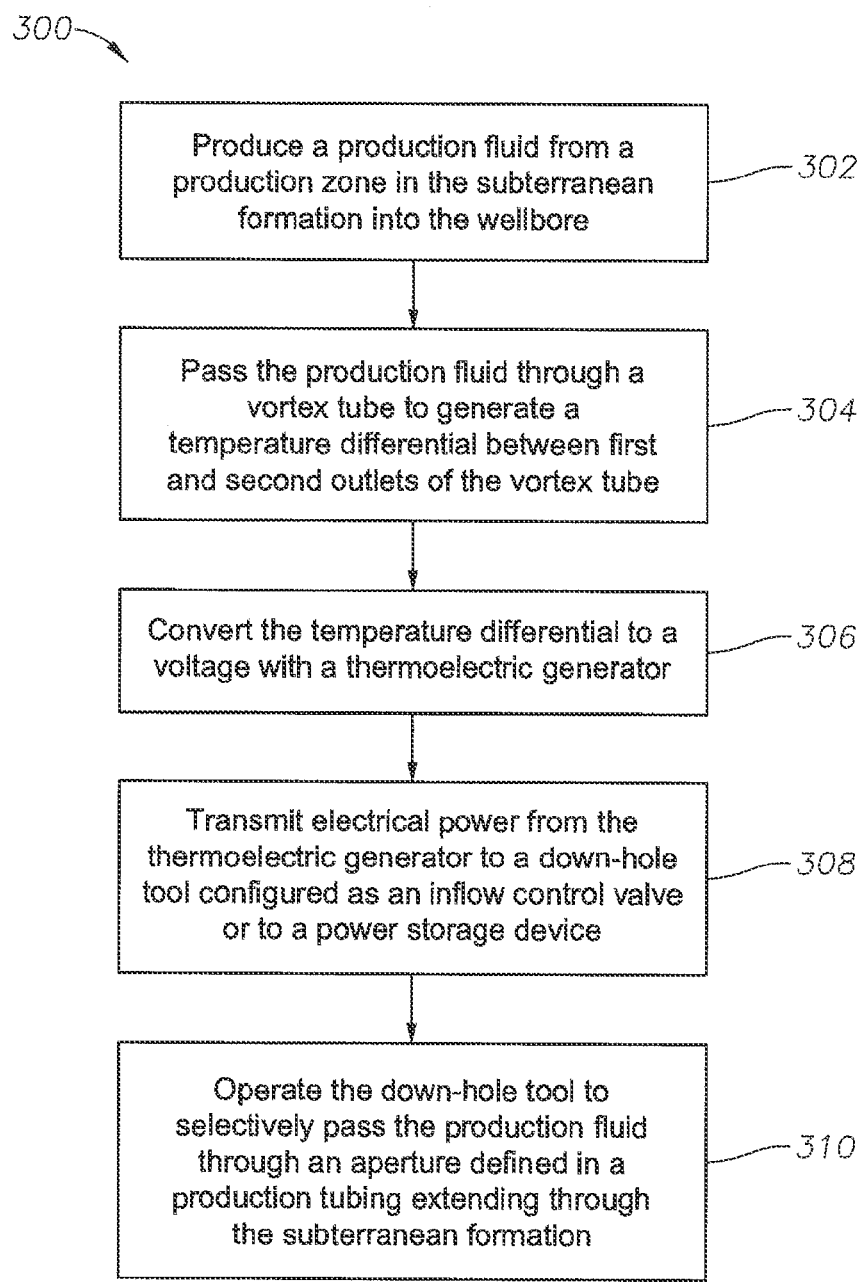
FIG. 4 is a flow diagram illustrating an example embodiment of an operational procedure in accordance with the present invention.

Referring now to FIG. 4, an operational procedure 300 for use of power generation system 150 (see FIGS. 1 and 2) is described. A production fluid is produced (step 302) from production zone 102b such that the production fluid enters wellbore 100. The production fluid is then passed through vortex tube 152 to generate a temperature differential between first and second outlets 172, 180 (step 304). The temperature differential is converted to voltage (step 306) with thermoelectric generator 154 and first and second thermocouples 182, 184. Electrical power is transmitted (step 308) from thermoelectric generator 154 to a down-hole tool such as inflow control valve 164. In some embodiments, the power is temporarily stored in power storage device 156 before being transmitted to inflow control valve 164. Inflow control valve 164 is operated (step 310), employing the electrical power transmitted thereto to selectively pass the production fluid through aperture 124 defined in production tubing 122. In this manner, power generation system 150 harvests energy stored in the production fluid by generating a temperature differential in a down-hole segment of wellbore 100, which may be generally isothermal, and employing the harvested energy to drive a down-hole tool.

The present invention described herein, therefore, is well adapted to carry out the objects and attain the ends and advantages mentioned, as well as others inherent therein. While a presently preferred embodiment of the invention has been given for purposes of disclosure, numerous changes exist in the details of procedures for accomplishing the desired results. These and other similar modifications will readily suggest themselves to those skilled in the art, and are intended to be encompassed within the spirit of the present invention disclosed herein and the scope of the appended claims.

What is claimed is:

1. A power generation system for generating electric power in a wellbore formed in a subterranean formation, the power generation system comprising:
 a source of pressurized fluid, wherein the source of pressurized fluid is a production zone in the subterranean formation containing a hydrocarbon containing fluid, wherein the pressurized fluid is a production fluid produced under pressure the production zone;
 a thermoelectric generator operable to generate a voltage in response to an applied temperature differential; and
 a vortex tube operatively coupled to the thermoelectric generator to apply the temperature differential thereto, the vortex tube comprising:
  an elongate hollow body;
  an inlet in fluid communication with the source of pressurized fluid, wherein the inlet of the vortex tube is operable to be in fluid communication with the subterranean formation, wherein the inlet of the vortex tube is in fluid communication with the subterranean formation through a perforation of a casing, the casing surrounding a production tubing;
  a first outlet in thermal communication with a radially outer region of the elongate hollow body, the first outlet operatively associated with a high temperature input to the thermoelectric generator; and
  a second outlet in thermal communication with a radially inner region of the elongate hollow body, the second outlet operatively associated with a low temperature input to the thermoelectric generator.

2. The power generation system according to claim 1, wherein the first and second outlets of the vortex tube are operable to be in fluid communication with the production tubing such that a flow path defined between the subterranean formation and the production tubing extends through the vortex tube.

3. The power generation system according to claim 1, further comprising an electrically powered down-hole tool in electrical communication with the thermoelectric generator, wherein the electrically powered down-hole tool is operable to selectively receive power generated by the thermoelectric generator.

4. The power generation system according to claim 3, wherein the electrically powered down-hole tool is an inflow control valve configured for regulating a flow of fluids between an interior and an exterior of the production tubing extending through the subterranean formation.

5. The power generation system according to claim 3, further comprising a power storage device electrically coupled between the thermoelectric generator and the electrically powered down-hole tool.

6. The power generation system according to claim 1, wherein the vortex tube is configured as a counter-flow vortex tube with the first and second outlets disposed on longitudinally opposite sides of the elongate hollow body.

7. A power generation system for harvesting energy in a wellbore extending through a subterranean formation, the power generation system comprising: a source of pressurized fluid, wherein the source of pressurized fluid is a production zone in the subterranean formation containing a hydrocarbon containing fluid, wherein the pressurized fluid is a production fluid produced under pressure the production zone;
 a thermoelectric generator operable to generate a voltage in response to an applied temperature differential; and
 a vortex tube operatively coupled to the thermoelectric generator to apply the temperature differential thereto, the vortex tube comprising:
  an elongate hollow body;
  an inlet operable to be in fluid communication with the subterranean formation through a perforation of a casing, the casing surrounding a production tubing and operable to generate a swirling flow of the production fluid along a radially outer region of the elongate hollow body;
  a first outlet disposed in the radially outer region of the elongate hollow body and operable to discharge a first portion of the swirling flow of the production fluid, the first outlet operatively coupled to a high temperature input to the thermoelectric generator;
  a restrictor operable to redirect a second portion of the flow of production fluid from the radially outer region of the elongate hollow body to a radially inner region of the elongate hollow body; and
  a second outlet disposed in the radially inner region of the elongate hollow body and operable to discharge a second portion of the swirling flow of the production fluid, the second outlet operatively coupled to a low temperature input of the thermoelectric generator.

8. The power generation system according to claim 7, wherein the vortex tube is disposed in an annular region defined between the subterranean formation and the production tubing extending through the subterranean formation.

9. The power generation system according to claim 8, wherein the annular region is defined between two longitudinally spaced isolation members extending around the production tubing and engaging an annular wall of subterranean formation.

10. The power generation system according to claim 9, wherein a pressure differential of about 300 psi is defined between an inlet to the vortex tube and an aperture defined in the production tubing, wherein the aperture is in fluid communication with the first and second outlets of the vortex tube.

11. The power generation system according to claim 9, wherein an inflow control valve is disposed at an aperture defined in the production tubing, wherein the aperture is in fluid communication with the first and second outlets of the vortex tube, and wherein the inflow control valve is electrically coupled to the thermoelectric generator to receive power therefrom.

12. The power generation system according to claim 7, further comprising first and second thermocouples respectively in thermal communication with the first and second outlets of the vortex tube, wherein the first and second outlets of the vortex tube are respectively operably coupled to the high and low temperature inputs of the thermoelectric generator through the first and second thermocouples.

13. The power generation system according to claim 7, wherein the restrictor is movable with respect to elongate hollow body such that an annular orifice defining the first outlet of the vortex tube is adjustable in size.

\* \* \* \* \*